United States Patent
Kinoshita et al.

(10) Patent No.: US 9,287,249 B2
(45) Date of Patent: Mar. 15, 2016

(54) SEMICONDUCTOR DEVICE

(71) Applicant: Panasonic Corporation, Kadoma-shi, Osaka (JP)

(72) Inventors: Tomohiro Kinoshita, Hyogo (JP); Eiji Takahashi, Nara (JP); Naoki Komatsu, Osaka (JP); Kazuhide Uriu, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/389,621

(22) PCT Filed: Mar. 12, 2013

(86) PCT No.: PCT/JP2013/001618
§ 371 (c)(1),
(2) Date: Sep. 30, 2014

(87) PCT Pub. No.: WO2013/153742
PCT Pub. Date: Oct. 17, 2013

(65) Prior Publication Data
US 2015/0062437 A1  Mar. 5, 2015

(30) Foreign Application Priority Data
Apr. 11, 2012 (JP) .................................. 2012-090205

(51) Int. Cl.
*H01L 25/18* (2006.01)
*H01L 25/065* (2006.01)
(Continued)

(52) U.S. Cl.
CPC .......... *H01L 25/18* (2013.01); *H01L 23/49838* (2013.01); *H01L 23/5389* (2013.01); *H01L 24/19* (2013.01); *H01L 24/49* (2013.01); *H01L 25/0657* (2013.01); *H04N 21/42607* (2013.01); *H01L 24/05* (2013.01); *H01L 24/06* (2013.01);
(Continued)

(58) Field of Classification Search
None
See application file for complete search history.

(56) References Cited

U.S. PATENT DOCUMENTS

| 5,373,189 A * | 12/1994 | Massit | ................ H01L 25/0652 257/686 |
| 6,337,226 B1 * | 1/2002 | Symons | .............. H01L 23/3185 257/777 |

(Continued)

FOREIGN PATENT DOCUMENTS

| JP | 2003-068975 | 3/2003 |
| JP | 2004/039929 | 2/2004 |

(Continued)

*Primary Examiner* — Charles Garber
*Assistant Examiner* — Alia Sabur
(74) *Attorney, Agent, or Firm* — Hamre, Schumann, Mueller & Larson, P.C.

(57) ABSTRACT

A semiconductor device comprises a first semiconductor chip; and a second semiconductor chip provided on the first semiconductor chip with having chip-on-chip connection to the first semiconductor chip, wherein when seen from a direction perpendicular to an upper surface of the second semiconductor chip, an outline of the second semiconductor chip is larger than an outline of the first semiconductor chip, a plurality of electrode terminals for the first semiconductor chip are provided on an upper surface of the first semiconductor chip, the plurality of electrode terminals for the first semiconductor chip comprise one or more first covered terminals which are covered with the second semiconductor chip and one or more first uncovered terminals which are not covered with the second semiconductor chip.

15 Claims, 12 Drawing Sheets

(51) Int. Cl.
*H01L 23/498* (2006.01)
*H01L 23/538* (2006.01)
*H01L 23/00* (2006.01)
*H04N 21/426* (2011.01)
*H04N 5/775* (2006.01)

(52) U.S. Cl.
CPC .......... *H01L 24/16* (2013.01); *H01L 24/32* (2013.01); *H01L 24/45* (2013.01); *H01L 24/48* (2013.01); *H01L 24/73* (2013.01); *H01L 24/81* (2013.01); *H01L 24/92* (2013.01); *H01L 2224/02375* (2013.01); *H01L 2224/0401* (2013.01); *H01L 2224/04042* (2013.01); *H01L 2224/04105* (2013.01); *H01L 2224/05553* (2013.01); *H01L 2224/05567* (2013.01); *H01L 2224/05568* (2013.01); *H01L 2224/05569* (2013.01); *H01L 2224/06135* (2013.01); *H01L 2224/16145* (2013.01); *H01L 2224/32145* (2013.01); *H01L 2224/32225* (2013.01); *H01L 2224/451* (2013.01); *H01L 2224/48091* (2013.01); *H01L 2224/48096* (2013.01); *H01L 2224/48106* (2013.01); *H01L 2224/48145* (2013.01); *H01L 2224/48227* (2013.01); *H01L 2224/49051* (2013.01); *H01L 2224/49097* (2013.01); *H01L 2224/49113* (2013.01); *H01L 2224/49175* (2013.01); *H01L 2224/73204* (2013.01); *H01L 2224/73207* (2013.01); *H01L 2224/73253* (2013.01); *H01L 2224/73265* (2013.01); *H01L 2224/81193* (2013.01); *H01L 2224/92125* (2013.01); *H01L 2225/0651* (2013.01); *H01L 2225/06513* (2013.01); *H01L 2225/06562* (2013.01); *H01L 2924/00014* (2013.01); *H01L 2924/1431* (2013.01); *H01L 2924/1434* (2013.01); *H01L 2924/15311* (2013.01); *H01L 2924/18162* (2013.01); *H01L 2924/3011* (2013.01); *H01L 2924/3025* (2013.01); *H04N 5/775* (2013.01)

(56) References Cited

U.S. PATENT DOCUMENTS

| | | | | |
|---|---|---|---|---|
| 6,621,155 | B1* | 9/2003 | Perino | H01L 23/3128 174/538 |
| 6,677,674 | B2 | 1/2004 | Nagao | |
| 6,740,980 | B2 | 5/2004 | Hirose | |
| 7,746,656 | B2* | 6/2010 | Shim | H01L 23/3128 174/260 |
| 8,077,478 | B2 | 12/2011 | Takatori et al. | |
| 8,411,450 | B2 | 4/2013 | Yamazaki et al. | |
| 8,787,032 | B2* | 7/2014 | Haba | H01L 23/13 361/803 |
| 2002/0192855 | A1 | 12/2002 | Nagoa | |
| 2003/0001252 | A1* | 1/2003 | Ku | H01L 23/3107 257/686 |
| 2003/0038374 | A1* | 2/2003 | Shim | H01L 23/3128 257/777 |
| 2004/0004291 | A1 | 1/2004 | Hirose | |
| 2005/0156323 | A1* | 7/2005 | Tokunaga | H01L 23/13 257/778 |
| 2005/0248019 | A1* | 11/2005 | Chao | H01L 25/0657 257/686 |
| 2006/0091518 | A1* | 5/2006 | Grafe | H01L 23/49838 257/686 |
| 2006/0220262 | A1* | 10/2006 | Meyer | H01L 21/568 257/779 |
| 2006/0267173 | A1 | 11/2006 | Takiar et al. | |
| 2007/0241442 | A1* | 10/2007 | Ha | H01L 25/03 257/686 |
| 2008/0061412 | A1* | 3/2008 | Shen | H01L 23/49531 257/670 |
| 2008/0205016 | A1 | 8/2008 | Takatori et al. | |
| 2008/0217767 | A1* | 9/2008 | Tago | H01L 23/481 257/737 |
| 2009/0267224 | A1* | 10/2009 | Landry | H01L 24/06 257/723 |
| 2010/0022035 | A1* | 1/2010 | Yamano | H01L 23/585 438/15 |
| 2010/0025849 | A1* | 2/2010 | Koh | H01L 24/05 257/738 |
| 2010/0148344 | A1* | 6/2010 | Chandra | H01L 23/5385 257/690 |
| 2010/0155918 | A1* | 6/2010 | Kim | H01L 23/3128 257/686 |
| 2010/0181661 | A1* | 7/2010 | Takemoto | H01L 24/24 257/686 |
| 2010/0244217 | A1* | 9/2010 | Ha | H01L 23/13 257/686 |
| 2010/0246144 | A1 | 9/2010 | Yamazaki et al. | |
| 2011/0108995 | A1* | 5/2011 | Nah | H01L 24/16 257/777 |
| 2011/0175222 | A1* | 7/2011 | Kim | H01L 23/16 257/738 |
| 2011/0291261 | A1* | 12/2011 | Fleischman | H01L 24/06 257/737 |
| 2012/0001339 | A1* | 1/2012 | Malatkar | H01L 23/13 257/773 |
| 2012/0139125 | A1* | 6/2012 | Kang | H01L 23/3135 257/774 |
| 2014/0103502 | A1* | 4/2014 | Yokoyama | H01L 23/3128 257/666 |
| 2014/0124941 | A1* | 5/2014 | Sakamoto | H01L 25/0657 257/773 |
| 2015/0155269 | A1* | 6/2015 | Zohni | H01L 23/13 257/777 |

FOREIGN PATENT DOCUMENTS

| | | |
|---|---|---|
| JP | 2006-073625 | 3/2006 |
| JP | 2008-543059 | 11/2008 |
| JP | 2009-170514 | 7/2009 |
| JP | 2010-0141080 | 6/2010 |
| JP | 2011/061234 | 3/2011 |
| JP | 2013030568 A * | 2/2013 |
| WO | WO 2007/086481 | 8/2007 |

* cited by examiner

SEMICONDUCTOR DEVICE

TECHNICAL FIELD

The present invention relates to a semiconductor device using chip-on-chip (CoC) technology for stacking and connecting semiconductor chips with each other.

BACKGROUND ART

In a system such as a digital television or a recorder, an amount of data to be processed is increasing exponentially with increased performance. Therefore, a semiconductor memory mounted in the system is required to have an increased capacity and an improved data transfer rate.

As a semiconductor device to be mounted in such a system, System-on-Chip (SoC) where a logic circuit chip mounted with a memory controller thereon and a memory are stacked in a single chip may be employed, or System-in-Package (SiP) where the logic circuit chip mounted with the memory controller thereon and the memory are stacked to be housed in one package may be employed.

At present, there is a tendency to employ a system using SiP whose manufacturing cost is relatively low. In order to increase the data transfer rate between the memory chip and the logic circuit chip in SiP, Chip-on-Chip (CoC) technology can be used for making flip-chip connection of the chips directly via a micro bump, etc (between the memory chip and the logic circuit chip). By way of example, there is a fan-out type of CoC technique (for example, see Patent Literature 1).

In Patent Literature 1, as shown in FIG. 13, an extension part 202 is provided lateral to a semiconductor chip 201 on a lower stage, and a semiconductor chip 203 is stacked on the semiconductor chip 201 and then comes on an upper stage. On the other hand, in an integrated circuit package 300 of Patent Literature 2, as shown in FIG. 14, integrated circuit dies 304, 306, 308, 310 are stacked on a substrate 302, and upper surfaces of the integrated circuit dies 304, 306, 308, 310 are connected to an upper surface of the substrate 302 by wires 312, 314, 316, 318, respectively. In Patent Literature 2, the integrated circuit dies 304, 306, 308, 310 are of the same size. In Patent Literature 2, as shown in FIG. 15, on an upper surface 402 of one integrated circuit die 420, each of bonding pads 414 provided on one side 410 is re-distributed via a metal wire 416 to one of bonding pads 418 between bonding pads 412 provided on the other side 408.

PATENT LITERATURE

Patent Literature 1: JP 2010-141080 A
Patent Literature 2: JP 2008-543059 A

SUMMARY OF INVENTION

Technical Problem

However, according to the method of Patent Literature 1, as shown in FIG. 13, a terminal 204 of the semiconductor chip 201 on the lower stage is electrically-connected by a rewiring part 206 to a wire-bonding connecting terminal 205 provided in the extension part 202, and substances in a surrounding area of the rewiring part 206 are different between the semiconductor chip 201 and the extension part 202. The difference in the substance characteristics between the semiconductor chip 201 and the extension part 202 causes discontinuity of impedance characteristics. The discontinuity of impedance characteristics may interrupt communication of a high-speed signal transmitted through the rewiring part 206 of the semiconductor chip 201. Therefore, a high data transfer rate could not be achieved.

Further, the method of Patent Literature 2 is a technique of stacking the integrated circuit dies 304, 306, 308, 310 of the same size as shown in FIG. 14. Also, unlike Chip-on-Chip connection, the method of Patent Literature 2 is a technique of wiring across the upper surfaces of the integrated circuit dies where no obstacle exists. Therefore, this method cannot be applied to make the Chip-on-Chip connection.

Accordingly, it is an object of the present invention to solve the above problems and provide a semiconductor device having a high data transfer rate.

Solution to Problem

In order to achieve the above object, one aspect of the present invention has a following configuration.

One aspect of the present invention provides a semiconductor device including:

a first semiconductor chip; and a second semiconductor chip provided on the first semiconductor chip with having chip-on-chip connection to the first semiconductor chip, wherein when seen from a direction perpendicular to an upper surface of the second semiconductor chip, an outline of the second semiconductor chip is larger than an outline of the first semiconductor chip, a plurality of electrode terminals for the first semiconductor chip are provided on an upper surface of the first semiconductor chip, the plurality of electrode terminals for the first semiconductor chip include one or more first covered terminals which are covered with the second semiconductor chip and one or more first uncovered terminals which are not covered with the second semiconductor chip.

Such a general and certain aspect may be realized by a system, a method, a computer program, and any combination thereof.

Advantageous Effects of Invention

According to the one aspect of the present invention, the electrode terminals formed on the first semiconductor chip on a lower stage includes the covered terminal which is covered with the second semiconductor chip on a upper stage and the uncovered terminal which is not covered with the second semiconductor chip. By including the covered terminal and the uncovered terminal, the semiconductor device having a high data transfer rate can be realized.

BRIEF DESCRIPTION OF THE DRAWINGS

Features and aspects thereof of the present invention will become apparent from the following description taken in conjunction with the preferred embodiments for the appended drawings.

DESCRIPTION OF EMBODIMENTS

Figure 1:
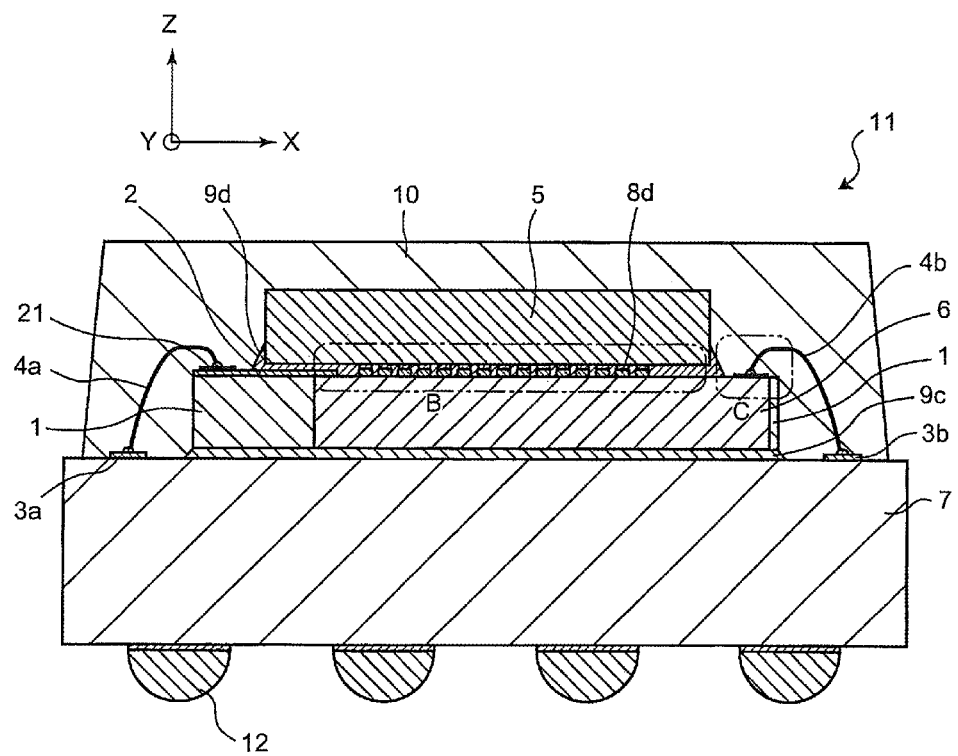
FIG. 1 is a cross-sectional view of a semiconductor device according to Embodiment 1.

A first aspect of the present invention provides a semiconductor device including:

a first semiconductor chip; and a second semiconductor chip provided on the first semiconductor chip with having chip-on-chip connection to the first semiconductor chip, wherein when seen from a direction perpendicular to an upper surface of the second semiconductor chip, an outline of the second semiconductor chip is larger than an outline of the first semiconductor chip, a plurality of electrode terminals for the first semiconductor chip are provided on an upper surface of the first semiconductor chip, the plurality of electrode terminals for the first semiconductor chip include one or more first covered terminals which are covered with the second semiconductor chip and one or more first uncovered terminals which are not covered with the second semiconductor chip.

Thus, by including the covered terminal and the uncovered terminal, the semiconductor device having a high data transfer rate can be achieved.

A second aspect of the present invention provides the semiconductor device of the first aspect, further including a first extension part which is formed on a periphery of or lateral to the first semiconductor chip and supports the second semiconductor chip, wherein one or more extension terminals are provided on an upper surface of the first extension part, and at least one of the extension terminals and at least one of the first covered terminals are connected by rewiring.

Thus, it is possible to transmit a signal stably by utilizing the extension terminal with the rewiring and the first uncovered terminal with no rewiring.

A third aspect of the present invention provides the semiconductor device of the second aspect, wherein the one or more extension terminals and the one or more first uncovered terminals are used as wire-bonding terminals.

Thus, it is possible to transmit the signal stably by utilizing the extension terminal with the rewiring and the first uncovered terminal with no rewiring as the wire-bonding terminals.

A fourth aspect of the present invention provides the semiconductor device of the second aspect, wherein at least one of the first uncovered terminals acts as an antenna or is connected to an antenna.

Thus, it is possible to transmit the signal stably by utilizing the at least one of the first uncovered terminal with no rewiring as the terminal for antenna.

A fifth aspect of the present invention provides the semiconductor device of any one of the second aspect to the fourth aspect, further including a wiring board including a wiring layer, wherein the wiring layer forms the rewiring.

Thus, when increasing the number of the wiring layer of the wiring board, the number of wires in the rewiring can be increased, making it possible to transmit more signals.

A sixth aspect of the present invention provides the semiconductor device of any one of the second aspect to the fifth aspect, further including:

a third semiconductor chip provided under the first semiconductor chip or under the first extension part; and a second extension part is formed on a periphery of or lateral to the third semiconductor chip, wherein the third semiconductor chip and the second extension part support the first semiconductor chip and the first extension part, a plurality of electrode terminals for the third semiconductor chip are provided on an upper surface of the third semiconductor chip, the plurality of electrode terminals for the third semiconductor chip include a second covered terminal which is covered with the first semiconductor chip or under the first extension part, and a second uncovered terminal which is not covered with the first semiconductor chip or under the first extension part.

Thus, it is possible to achieve, with no order constraint of the chips, a high data transfer rate of the semiconductor device having a Chip-on-Chip stacking structure where a plurality of semiconductor chips of the same or different sizes are stacked.

A seventh aspect of the present invention provides the semiconductor device of the sixth aspect, wherein the first uncovered terminal and the second uncovered terminal are arranged on other sides.

Thus, for example, when a high-speed signal is allocated to the uncovered terminal, it is possible to dissipate heat in the high-exothermic area effectively, which leads to achieve a high-heat-dissipation characteristic.

An eighth aspect of the present invention provides the semiconductor device of any one of the second aspect to the seventh aspect, wherein the extension part is an insulated component.

Thus, it is possible to transmit a signal through wiring in the extension part.

A ninth aspect of the present invention provides the semiconductor device of any one of the first aspect to the eighth aspect, wherein the plurality of uncovered terminals are arranged on neighboring sides of the first semiconductor chip.

Thus, for example, when a high-speed signal is allocated to the uncovered terminal, it is possible to dissipate heat in the high exothermic area effectively, which leads to achieve a high-heat-dissipation characteristic.

A tenth aspect of the present invention provides the semiconductor device of any one of the first aspect to the ninth aspect, wherein the first semiconductor chip and the second semiconductor chip are arranged such that, when seen from the direction perpendicular to the upper surface of the second semiconductor chip, one side of the first semiconductor chip is not parallel to and not perpendicular to one side of the second semiconductor chip.

Thus, for example, when a high-speed signal is allocated to the uncovered terminal, it is possible to dissipate heat in the high exothermic area effectively, which leads to achieve a high heat-dissipation characteristic.

A eleventh aspect of the present invention provides the semiconductor device of any one of the first aspect to the tenth aspect, wherein the plurality of first covered terminals include a plurality of connecting terminals, and wherein the plurality of connecting terminals include a terminal connected to the second semiconductor chip and a terminal not connected to the second semiconductor chip.

Thus, by providing the dummy terminal of the covered terminal, which is not connected to the second semiconductor chip, it is possible to place the first semiconductor chip with various connecting pin arrangements under the second semiconductor chip.

A twelfth aspect of the present invention provides the semiconductor device of any one of the first aspect to the eleventh aspect, wherein the first semiconductor chip is a logic circuit chip and the second semiconductor chip is a memory chip.

A thirteenth aspect of the present invention provides the semiconductor device of any one of the first aspect to the twelfth aspect, wherein a priority signal is transmitted through the one or more uncovered terminals and a normal signal is transmitted through the one or more covered terminals.

Thus, it is possible to communicate the priority signal to outside directly so as to transmit a signal stably.

A fourteenth aspect of the present invention provides the semiconductor device of any one of the first aspect to the thirteenth aspect, wherein a signal having a highest data transfer rate of signals inputted to or outputted from the first semiconductor chip is transmitted through the one or more uncovered terminals.

Thus, it is possible to transmit the signal having the highest data transfer rate stably.

A fifteenth aspect of the present invention provides a digital television including:

an interface part which acts as an interface with outside;

the semiconductor device of any one of the first aspect to the fourteenth aspect, which outputs data based on a signal from the interface part; and a display part which displays based on the data outputted from the semiconductor device.

Thus, by utilizing the semiconductor device having the high data transfer rate in the digital television, it is possible to transmit a signal stably.

A sixteenth aspect of the present invention provides a recorder including:

an interface part which acts as an interface with outside;

the semiconductor device of any one of the first aspect to the fourteenth aspect, which outputs data based on a signal from the interface part; and a recording part which records the data outputted from the semiconductor device.

Thus, by utilizing the semiconductor device having the high data transfer rate in the recorder, it is possible to transmit signals stably.

Embodiments of the present invention are described hereinafter with reference to the drawings.

In the following drawings, the same reference numerals are assigned to components having substantially the same function for simplification of description. The present invention is not limited to the following embodiments.

Embodiment 1

Figure 2:
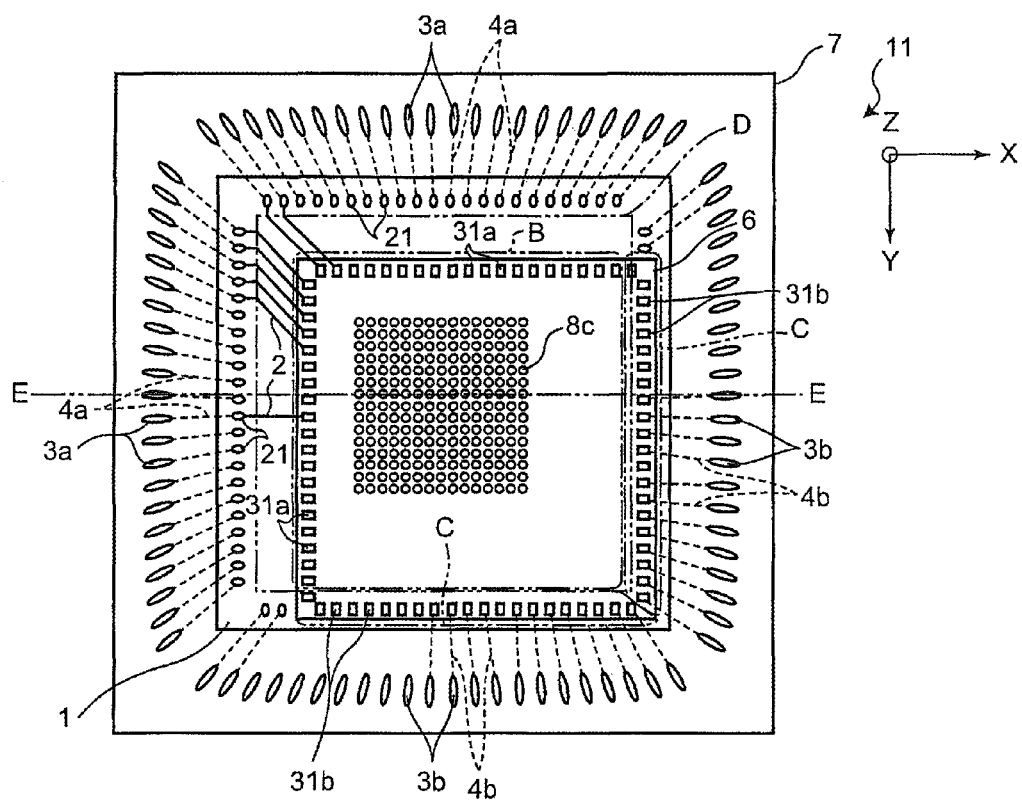
FIG. 2 is a top view of a semiconductor device according to Embodiment 1, where a memory chip is omitted.

FIG. 1 shows a cross-sectional view showing a schematic structure of a semiconductor device (semiconductor package) 11 according to Embodiment 1 of the present invention. FIG. 2 is a top view of the semiconductor device 11 according to Embodiment 1, where a semiconductor memory chip 5 is omitted. FIG. 1 corresponds to a cross-section along E-E in FIG. 2. A region D shown in FIG. 2 corresponds to a region onto which the semiconductor memory chip 5 is to be stacked.

The semiconductor device 11 includes a semiconductor logic circuit chip 6 (hereinafter, "logic chip 6") as an example of a first semiconductor chip, and the semiconductor memory chip 5 (hereinafter, "memory chip 5"), provided on the logic chip 6, as an example of a second semiconductor chip. As shown in FIGS. 1 and 2, an extension part 1 is formed on a periphery of the logic chip 6. The extension part 1 in Embodiment 1 is a part formed on side surfaces of the logic chip 6 on a lower stage so as to enlarge the logic chip 6 in a planar direction, supporting at least a part of the memory chip 5 on an upper stage. The extension part 1 is made of an insulating material such as ceramic or resin (that is, the extension part 1 is an insulating component). The extension part 1 and the logic chip 6 support the memory chip 5 entirely.

Semiconductor memory bumps 8*d* (hereinafter, "memory bumps 8*d*") are formed on a lower surface of the memory chip 5. Connecting terminals 8*c* for memory chip (hereinafter, "connecting terminals 8*c*") are formed on an upper surface of the logic chip 6. By metal-bonding the memory bumps 8*d* and the connecting terminals 8*c*, the logic chip 6 and the memory chip 5 are electrically-connected (and CoC connection is made). Between the memory chip 5, and the extension part 1 and the logic chip 6, underfill is injected, thereby forming a joint portion 9*d*. The joint portion 9*d* bonds the memory chip 5 to the logic chip 6 strongly.

A semiconductor package resin substrate 7 is arranged under the logic chip 6 and the extension part 1. Die-bonding between the semiconductor package resin substrate 7, and the logic chip 6 and the extension part 1 forms a joint portion 9*c*, making a strong bonding. Further, semiconductor package balls 12 are formed on a lower surface of the semiconductor package resin substrate 7 for making electrical connection to outside. A resin sealing part 10 is formed on an upper surface of the semiconductor package resin substrate 7 so as to cover the memory chip 5, the logic chip 6 and the extension part 1. The resin sealing part 10 covers the memory chip 5, the logic chip 6 and the extension part 1, thereby constituting the semiconductor device 11 as a semiconductor package having chips, wires and terminals therein.

For the above-described semiconductor device 11, wires and terminals sealed in the semiconductor device 11 by the resin sealing part 10 will be explained with reference to FIGS. 2 and 3.

As shown in FIG. 2, a group of connecting terminals 8*c* is provided on the upper surface of the logic chip 6. The group of connecting terminals 8*c* is located offset from a center of the upper surface of the logic chip 6, that is, shifted slightly toward an upper left corner of the logic chip 6. The connecting terminals 8*c* are provided for making electrical connection with the memory chip 5. A plurality of electrode terminals 31*a* and 31*b* for logic chip (electrode terminals 31*a*, 31*b* for first semiconductor chip) are formed on an outer periphery on the upper surface of the logic chip 6. The electrode terminals 31*a*, 31*b* for logic chip are densely arranged at equal intervals in the four periphery sides of the logic chip 6. Further, a plurality of extension terminals 21 are also formed on an upper surface of the extension part 1 which is placed on the periphery of the logic chip 6. The extension terminals 21 are densely arranged at equal intervals in two periphery sides of the extension part 1.

The region D in the upper surface of the logic chip 6 is covered by the memory chip 5 as described above, while the logic chip 6 according to Embodiment 1 is offset (in a lower-right position when viewed from above) with respect to the memory chip 5 as shown in FIG. 2. Thus, the upper surface of the logic chip 6 includes a region B to be covered with the memory chip 5 and a region C not to be covered with the memory chip 5.

Figure 3:
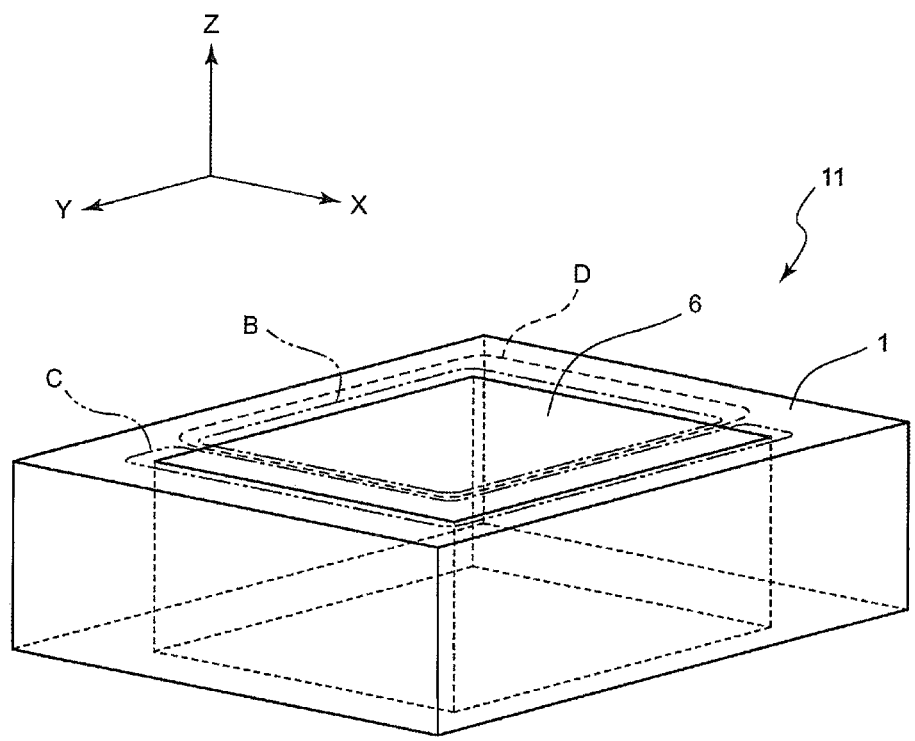
FIG. 3 is a perspective view of a semiconductor device according to Embodiment 1, where a memory chip is omitted.

FIG. 3 shows a perspective view of the logic chip 6 and the extension part 1, showing relationships between the above described regions B, C and D. Further, as shown in FIG. 3, with respect to the semiconductor device 11, a horizontal direction is referred to as X-direction, a front-back direction is referred to as Y-direction, and a vertical direction is referred to as Z-direction.

Returning back to FIG. 2, the electrode terminals 31*a*, 31*b* for logic chip include first covered terminals 31*a* which are covered with the memory chip 5 (positioned in the region B) and first uncovered terminals 31*b* which are not covered with the memory chip 5 (positioned in the region C). The first covered terminals 31*a* are connected to the extension terminals 21 of the extension part 1 by rewiring 2 which is, for example, made of copper. The extension terminals 21 and the first uncovered terminals 31*b* are connected to a plurality of pads 3*a* and 3*b* provided on the upper surface of the semiconductor package resin substrate 7 by wires 4*a* and 4*b*, respectively (this is wire-bonding connection). The pads 3*a* and 3*b* are connected to the semiconductor package balls 12 by wires provided in the semiconductor package resin substrate 7. By employing such an arrangement and a structure of the semiconductor device 11, the memory chip 5 and the logic chip 6 can transmit electrical signals to/from outside via the semiconductor package balls 12.

Covered with the memory chip 5, the connecting terminals 8*c* may be referred to as a kind of covered terminals.

While it has been described about Embodiment 1 that the extension part 1 surrounds the entire periphery of the logic chip 6 as shown in FIG. 2, the present invention is not limited to such a case. For example, the extension part 1 may surround only a (lateral) part of the sides of the logic chip 6. In Embodiment 1, widths of the extension part 1 covering lower and right sides of the logic chip 6 in FIG. 2, are set to be appropriate for using the wires 4*b* having predetermined lengths to connect the first uncovered terminals 31*h* to the pads 3*b*.

According to the above described semiconductor device 11, signals transmitted through the first covered terminals 31*a* flow to outside via the rewiring 2, while signals transmitted through the first uncovered terminals 31*b* flow to outside directly without rewiring that may cause impedance mismatch. In Embodiment 1, at a design phase of the logic chip 6, the first uncovered terminals 31*b* have been assigned to terminals through which signals including high frequency component are transmitted, while the first covered terminal 31*a* (and the extension terminals 21) have been assigned to terminals through which other signals are transmitted. That is, preferential signals (priority signals) which may include the high frequency component flow directly to outside without passing through the rewiring 2, and signals (normal signals) other than the priority signals flow to outside via the rewiring 2, making it possible to transmit the signals stably. Therefore, the semiconductor device 11 having the high data transfer rate can be realized. That is, among the signals inputted to/outputted from the logic chip 6, the signals having the highest data transfer rate can be transmitted through any of the first uncovered terminals 31*b*. In contrast, Patent Literature 2 does not disclose the relationships between the data transfer rate, and the assignment (allocation) of the signals to the bonding pads for re-distribution or the bonding pads not for re-distribution.

In Embodiment 1, while the terminals through which the signals including the high frequency component are transmitted are set as the terminals the first uncovered terminals 31*b* have been assigned to, the terminals the first uncovered terminals 31*b* have been assigned to are not limited thereto. For example, if the first uncovered terminals 31*h* have been assigned to power supply terminals, it is possible to stabilize power supply potential. Further, if the first uncovered terminals 31*b* have been assigned to ground terminals, it is possible to stabilize ground potential. Further, a design support apparatus which performs automatic assignment to the first uncovered terminals 31*b* by reading attributes of the terminals may be employed so as to increase efficiency of the assignment to the first uncovered terminals 31*b*.

In addition, amount of heat to be generated become large in an area where high speed signals such as signals including the high frequency component are transmitted, while the first uncovered terminals 31*b* are located in the open area C where heat is likely to be dissipated. In Embodiment 1, by previously assigning the first uncovered terminals 31*b* to the terminals through which the high speed signals are transmitted, high-exothermic parts can be efficiently dissipated, achieving high heat dissipation performance.

While the uncovered region C is set to the two neighboring sides of the logic chip 6 shown in FIG. 2, the number of sides of the logic chip 6 to include the uncovered region C can be suitably set (one or three, for example). Further, the number of sides of the logic chip 6 to include the uncovered region C can be set in accordance with the number of signals and terminals to be handled, and the number of first uncovered terminals 31*b* can be adjusted, thereby increasing a degree of freedom in designing and further improving the heat dissipation performance.

Further, according to Embodiment 1, by offsetting central positions and angles of the semiconductor chip stacked, some area of the semiconductor chip (logic chip 6) on the lower stage become the open (uncovered) area which are not covered with the semiconductor chip (memory chip 5) on the upper stage. Thus, signals can be passed directly to outside via the wires from the terminals (first uncovered terminals 31*b*) provided on the semiconductor chip on the lower stage.

Further, according to Embodiment 1, by making a part of the semiconductor chip on the lower stage as the open area, signals can be passed directly to outside from the terminals provided on the semiconductor chip on the lower stage, thereby inhibiting the impedance discontinuities and transmitting the high-speed signals.

While the memory chip 5 is arranged on the upper stage and the logic chip 6 is arranged on the lower stage in Embodiment 1, the memory chip 5 may be arranged on the lower stage and the logic chip 6 may be arranged on the upper stage.

Further, while the lower chip and the upper chip may be of substantially the same size and shape, the sizes and shapes of the chips are not limited thereto. For example, the lower chip may be small and the upper chip may be large. That is, when viewed from a direction perpendicular to the top surface of the upper chip, an outline (outer shape) of the upper chip may be larger than an outline of the lower chip. For example, the outline of the chip mentioned here may also be referred to as an area of the chip.

Further, while the extension terminals 21 and the first uncovered terminals 3b are connected to the pads 3a and 3b by wire-bonding, respectively, in Embodiment 1, connecting methods of the extension terminals 21 and the first uncovered terminals 31b are not limited thereto. For example, the extension terminals 21 and the first uncovered terminals 31b may be connected to antennas or may function as antennas by themselves. Alternatively, the extension terminals 21 and the first uncovered terminals 31b may be connected to flexible substrates.

Further, while the plurality of extension terminals 21 and the plurality of first uncovered terminals 31a are connected by the rewiring in Embodiment 1, not limited to such a case, at least one of the extension terminals 21 and at least one of the first covered terminals 31a may be connected by the rewiring.

Embodiments 2-7 will be explained with respect to FIGS. 4-9, respectively, below.

Embodiment 2

Figure 4:
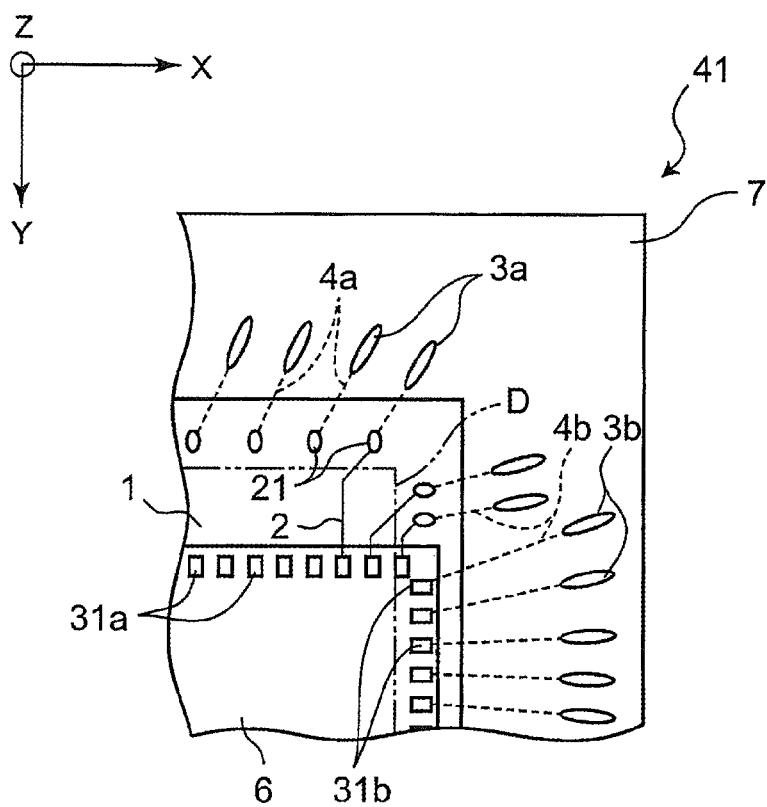
FIG. 4 is a partially-enlarged top view of a semiconductor device according to Embodiment 2, where a memory chip is omitted.

FIG. 4 shows a partially-enlarged top view (corresponding to the upper and right part of FIG. 2) of a semiconductor device 41 according to Embodiment 2, where the memory chip 5 is omitted. If pitches of the first uncovered terminals 31b are significantly smaller than pitches of the extension terminals 21, design rule constraints of the semiconductor package resin substrate 7 may prevent the placement of all the pads 3b to be connected to the first uncovered terminals 31b. In such a case, as shown in FIG. 4, setting distances between the first uncovered terminals 31b and the pads 3b to be larger than distances between the extension terminals 21 and the pads 3a can realize the placement of all the pads 3b.

Embodiment 3

Figure 5:
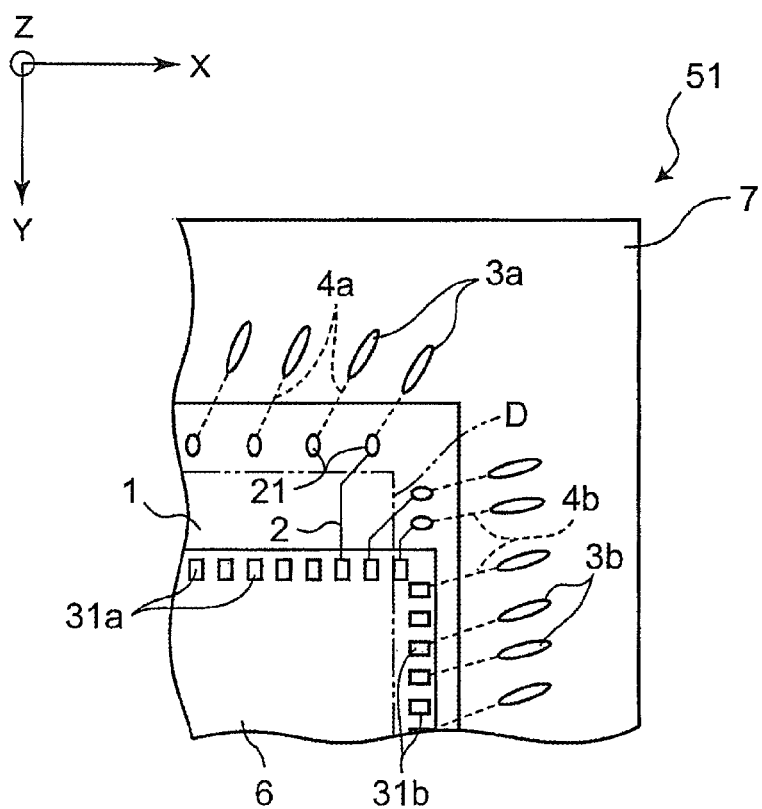
FIG. 5 is a partially-enlarged top view of a semiconductor device according to Embodiment 3, where a memory chip is omitted.

FIG. 5 shows a partially-enlarged top view of a semiconductor device 51 according to Embodiment 3, where the memory chip 5 is omitted. In order to improve transmission characteristics of the signals, it is effective to shorten the lengths of the wires 4. Thus, shortening the lengths of the wires 4b connecting the first uncovered terminals 31b, in particular, can improve the transmission characteristics of the priority signals. The lengths of the wires 4b can be shortened by thinning out the first uncovered terminals 31b as shown in FIG. 5 and thus shortening the distances from the first uncovered terminals 31b to the pads 3b, thereby improving the data transfer rate more. While the first uncovered terminals 31b are thinned out in Embodiment 3, it is possible to achieve the same effect then reducing the number of the first uncovered terminals 31b (that is, broadening the pitches of the first uncovered terminals 31b) in advance.

Embodiment 4

Figure 6:
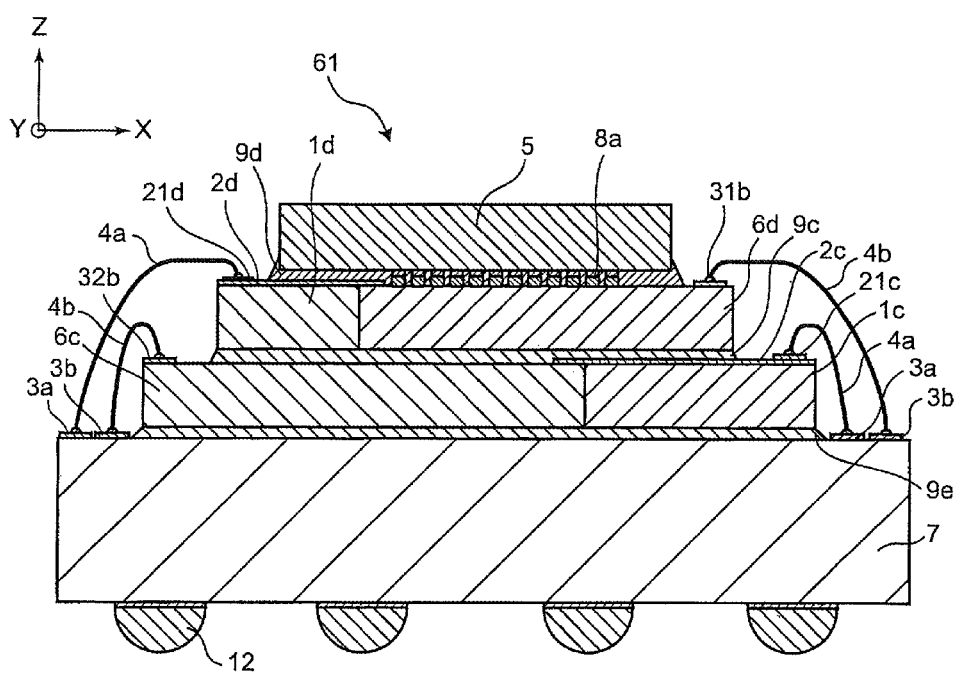
FIG. 6 is a cross-sectional view of a semiconductor device according to Embodiment 4.

FIG. 6 shows a cross-sectional view of a semiconductor device 61 according to Embodiment 4. The semiconductor device 61 can be made by adding, between the semiconductor resin package substrate 7, and the logic chip 6d and the extension part 1d of the semiconductor device 11 shown in FIG. 1, an additional pair of a logic chip 6c and an extension part 1C. The logic chip 6c on a lower stage is an example of a third semiconductor chip.

As shown in FIG. 6, between the logic chip 6c and the extension part 1c on the lower stage, and the logic chip 6d and the extension part 1d on a middle stage, a junction part 9c is formed by die-bonding. Thus, the logic chip 6c and the extension part 1C on the lower stage support the whole logic chip 6d and the whole extension part 1d on the middle stage. Also, between the semiconductor resin package substrate 7, and the logic chip 6c and the extension part 1c on the lower stage, a junction part 9e is formed by die-bonding. The semiconductor resin package substrate 7 supports the whole logic chip 6c and the whole extension part 1c on the lower stage.

Terminal-connection in the semiconductor 61 will be explained below. First extension terminals 21d formed on an upper surface of the extension part 1d on the middle stage are connected to first covered terminals 318 of the logic chip 6d on the middle stage via rewiring 2d, and also connected to the pads 3a on the upper surface of the semiconductor resin package substrate 7 via wires 4a. On the other hand, the first uncovered terminals 31b of the logic chip 6d on the middle stage are connected to the pads 3b on the upper surface of the semiconductor resin package substrate 7 via the wires 4b. In Embodiment 4, priority signals are transmitted through the first uncovered terminals 31b, and normal signals are transmitted through the first extension terminals 21d and the first covered terminals 31a.

Second extension terminals 21c formed on an upper surface of the extension part 1c on the lower stage are connected to second covered terminals 32a of the logic chip 6c on the lower stage via rewiring 2c, and also connected to the pads 3a on the upper surface of the semiconductor resin package substrate 7 via the wires 4a. On the other hand, second uncovered terminals 32b of the logic chip 6c on the lower stage are connected to the pads 3b on the upper surface of the semiconductor resin package substrate 7 via the wires 4b. In Embodiment 4, priority signals are transmitted through the second uncovered terminals 32b, and normal signals are transmitted through the second extension terminals 21c and the second covered terminals 32a.

The above configuration of the semiconductor device 61 can achieve the similar effects to the effects by the semiconductor device 11 shown in FIG. 1. That is, at design phases of the logic chip 6c and 6d, the first uncovered terminals 31b and 32b have been assigned to terminals through which signals including the high frequency component are transmitted, thereby making it possible to transmit the priority signals stably. Therefore, the semiconductor device 61 having the high data transfer rate can be realized. Further, in Embodiment 4, the memory chip 5 is positioned in the upper stage, and the logic chips 6d and 6c are positioned in the middle and lower stages, respectively, but the number and order of these chips can be set appropriately. That is, according to Embodiment 4, it is possible to realize a layered CoC structure in which a plurality of semiconductor chips of equivalent or different sizes can be stacked without its order restriction.

Further, in Embodiment 4, the logic chip 6d on the middle stage is positioned offset with respect to the memory chip 5 (in a lower-right position with respect to the memory chip 5 when viewed from above), and also the logic chip 6c on the lower stage is positioned offset with respect to the logic chip 6c and the extension part 1d on the lower stage (in a lower-left position with respect to the logic chip 6c and the extension part 1d when viewed from above). With this arrangement, the first uncovered terminals 31b are positioned on the right and lower sides of the logic chip 6d on the middle stage when viewed from above, while the second uncovered terminals 32b are positioned on the left and upper sides of the logic chip 6c on the lower stage when viewed from above. As shown in FIG. 6, the first uncovered terminals 31b are positioned on the right side of the logic chip 6d on the middle stage, while the second uncovered terminals 32b are positioned on the left side of the logic chip 6c on the lower stage. Thus, by varying the mutual positions of the uncovered terminals 31b and 32b in each stage, it is possible to disperse the uncovered terminals 31b and 32b which have high-heating-tendencies, and thus to improve heat dissipation characteristics of the semiconductor device 61.

In Embodiment 4, the first extension terminals 21d and the first uncovered terminals 31h on the middle stage are directly connected to the pads 3a and pads 3b of the semiconductor resin package 7, but connecting relationships of these are not limited thereto and can be set appropriately. For example, the first extension terminals 21d and the first uncovered terminals 31b on the middle stage may be connected to the second uncovered terminals 32b or the second extension terminals 21c on the lower stage. Thus, a degree of freedom in design can be enhanced.

Embodiment 5

Figure 7:
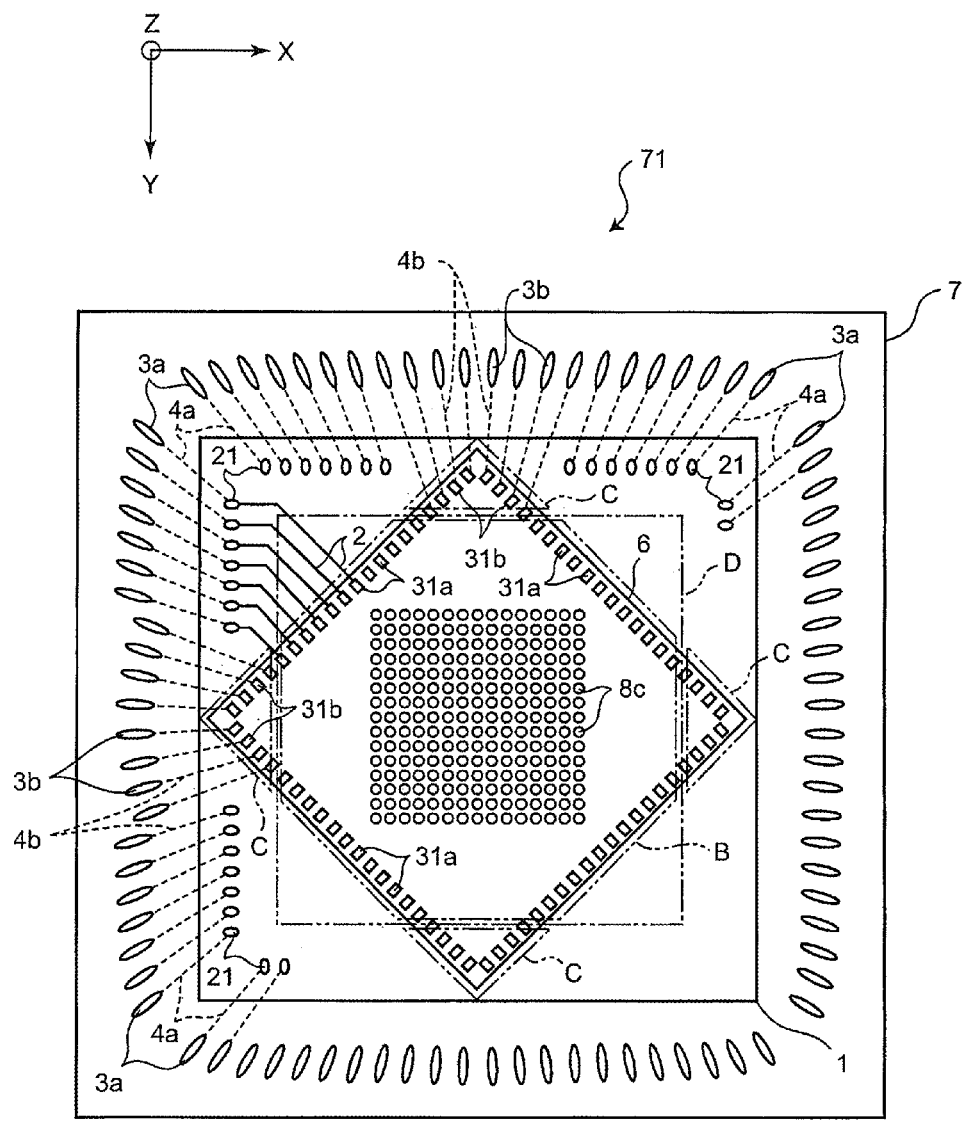
FIG. 7 is a top view of a semiconductor device according to Embodiment 5, where a memory chip is omitted.

FIG. 7 shows a top view of a semiconductor device 71 according to Embodiment 5, where a memory chip is omitted.

As shown in FIG. 7, when viewing the semiconductor device 71 from above, a memory chip 5 and a logic chip 6 have substantially the same shape of square. While center positions of the memory chip 5 and the logic chip 6 are substantially the same, sides of the memory chip 5 are arranged to be inclined with respect to sides of the logic chip 6 at an angle smaller than 90 degrees and greater than 0 degrees. That is, when viewed from a direction perpendicular to the top surface of the memory chip 5, one side of the memory chip 5 and one side of the logic chip 6 are arranged to be non-perpendicular and non-parallel (that is, not perpendicular and not parallel) with each other. Thus, arranging the logic chip 6 and the memory chip 5 at different angles in view from above defines uncovered regions C at the four corners of the logic chip 6, and defines a covered region B between the respective uncovered regions C. In Embodiment 5, the first uncovered terminals 31b placed in the uncovered regions C have been assigned to terminals through which priority signals are transmitted.

According to the above configuration of the semiconductor device 71, it is possible, as well as the semiconductor device 11 shown in FIG. 1, to transmit priority signals stably and to achieve the high data transfer rate. According to Embodiment 5, the first uncovered terminals 31b can be dispersed, so the degree of freedom in design can be enhanced and terminals having high-heating-tendencies can be dispersed, thereby improving the heat dissipation characteristics of the semiconductor device 71 further.

The number of the corners of the logic chip 6 to be arranged in the uncovered regions C, are not limited to four and can be set appropriately, for example, one, two, or three.

Embodiment 6

Figure 8:
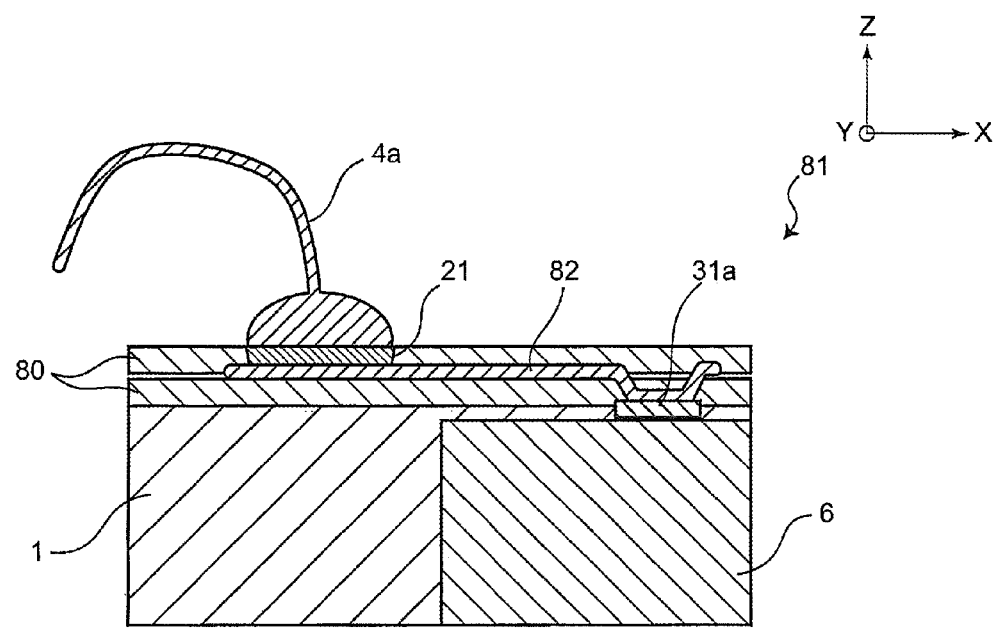
FIG. 8 is a cross-sectional view of a semiconductor device according to Embodiment 6, where a rewiring part is enlarged.

FIG. 8 shows an enlarged sectional view of rewiring in the semiconductor device 81 according to Embodiment 6.

While copper is employed as a material of the rewiring shown in FIG. 1, Embodiment 6 employs a printed circuit board as rewiring. Specifically, as shown in FIG. 8, a wiring board 80 having a wiring layer 82 is arranged on the logic chip 6 and the extension part 1 formed on the periphery of the logic chip 6. The wiring board 80 sandwiches the wiring layer 82 by two boards arranged vertically-spaced with each other, and an extension terminal 21 is formed on an upper side of the wiring board 80 to be connected to a wire 4a. The wiring layer 82 is connected to the extension terminal 21 inside the wiring board 80 and also connected to the first covered terminal 31a formed on the upper surface of the logic chip 6. With this arrangement, the extension terminal 21 and the first covered terminal 31a of the logic chip 6 are electrically connected with each other via the wiring layer 82.

According to Embodiment 6, it is possible to realize a layered CoC structure in which a plurality of semiconductor chips can be stacked without its size restriction. Further, in the wiring board 80, the number of the rewiring layers 82 as well as wiring number can be increased, thereby making it possible to transmit more signals.

The wiring board 80 may be a multi-layer board having two or more wiring layers 82. Thus, a degree of freedom in design can be enhanced.

The wiring board 80 may be a multi-layer board where wiring layers adjacent to the wiring layer 82 have a shielding structure formed by a so-called solid pattern. This makes it possible to improve signal transmission characteristics of the wiring layer 82 and thus to increase the data transfer rate further.

Embodiment 7

Figure 9:
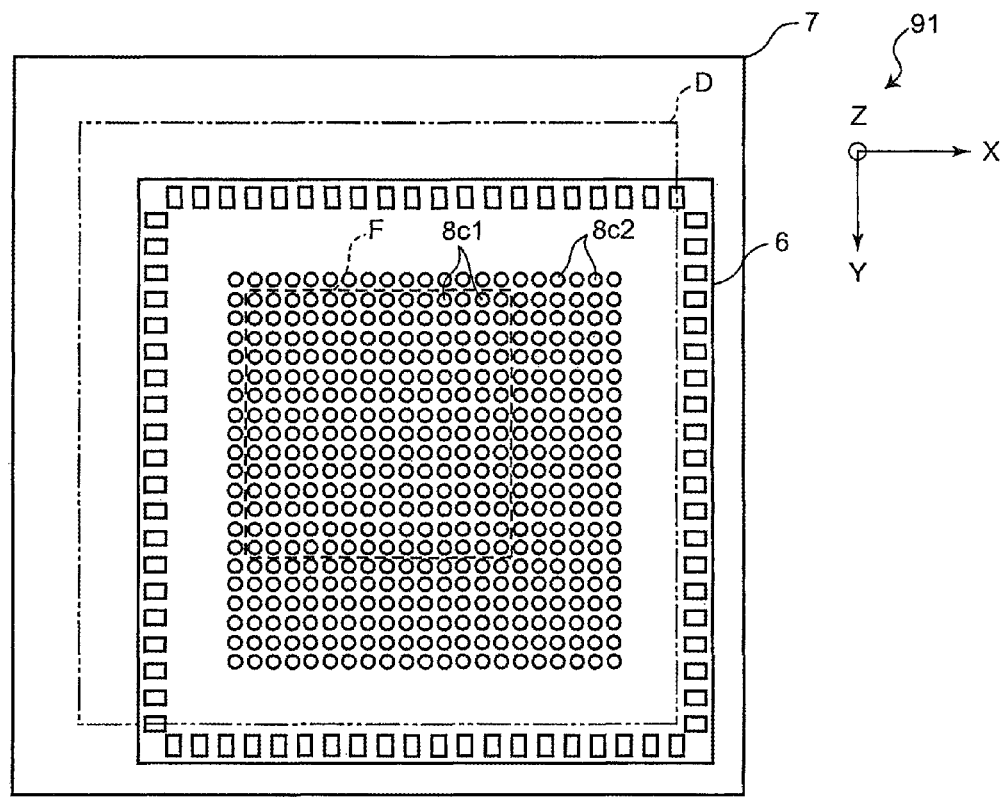
FIG. 9 is a top view of a semiconductor device according to Embodiment 7, where a memory chip is omitted.

FIG. 9 shows a top view of a semiconductor device 91 according to Embodiment 7, where the memory chip 5 is omitted. A region D shown in FIG. 9 corresponds to a region where the memory chip 5 is arranged, and a region F corresponds to a region where the memory bumps 8d of the memory chip 5 is arranged.

In Embodiment 7, on a top surface of the logic chip 6, connecting terminals 8c1 and 8c2 are deployed as many as possible. The connecting terminals 8c1 placed in the region F are electrically-connected to the memory chip 5 which is stacked on the logic chip 6. Meanwhile, the connecting terminals 8c2 placed in a different region from the region F are not electrically-connected to the memory chip 5 (which become dummy terminals 8c2). According to Embodiment 7, the connecting terminals 8c1 and 8c2 are distributed as many as possible and the connecting terminals 8c2 can be selectively connected to the memory chip 5.

The above configuration employs the dummy terminals 8c2 of the connecting terminals of the logic chip 6, thereby making it possible to stack memory chips having various connecting-pin arrangement.

Embodiment 8

Figure 10:
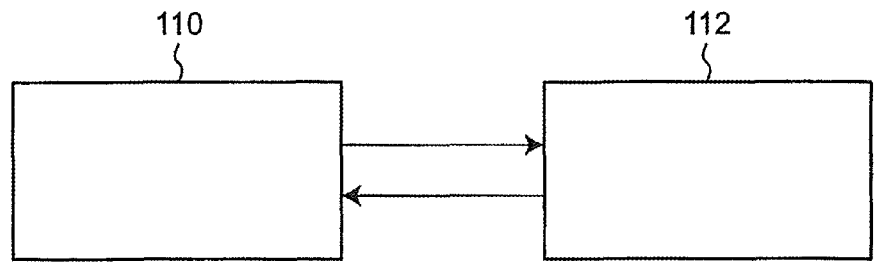
FIG. 10 is an external view of a digital television and a recorder according to Embodiment 8.

FIG. 10 shows an external view of a digital television 110 and a recorder 112 according to Embodiment 8. The digital television 110 according to Embodiment 8 can display an image based on data such as image data or control data. The recorder 112 according to Embodiment 8 can record data such as the image data or control data. The digital television 110 and the recorder 112 are connected with each other via a signal line such as a HDMI cable or the like, for example, and thus can transmit and receive the data such as the image data or control data with each other.

Figure 11:
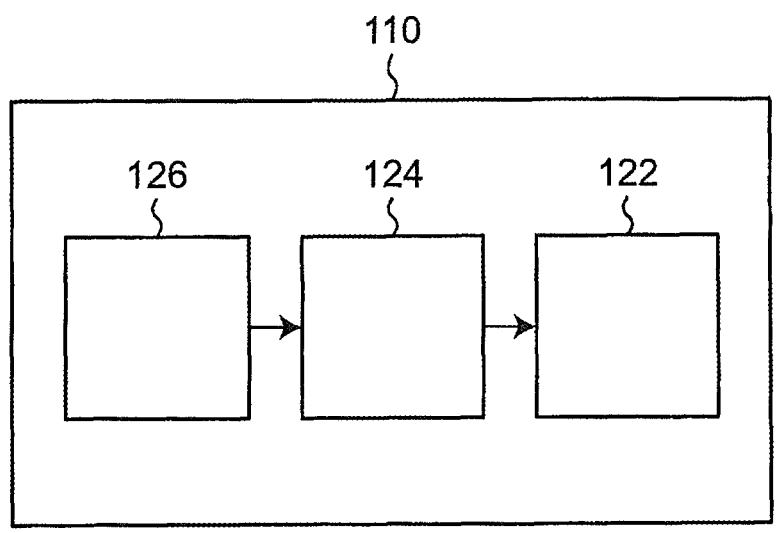
FIG. 11 is a block diagram of a digital television according to Embodiment 8.

FIG. 11 shows a block diagram of the digital television 110 shown in FIG. 10. The digital television 110 includes an interface part 126 which acts as an interface with outside, a semiconductor device 124 which outputs data based on a signal from the interface part 126, and a display part 122 which displays based on the data outputted from the semiconductor device 124.

The semiconductor device 124 outputs the data based on the signal from the interface part 126 as the interface with outside, and then the display part 122 displays based on the data outputted from the semiconductor device 124.

The interface part 126 may be an interface corresponding to the HDMI standard, for example. Alternatively, the interface part 126 may correspond to other interface standards. The semiconductor device 124 may include a semiconductor device according to any of Embodiments 1 to 7 described above, for example. The display part 122 may be a quid crystal display device, an organic EL display device or the like, for example. Alternatively, the display part 122 may be other types of display device.

Figure 12:
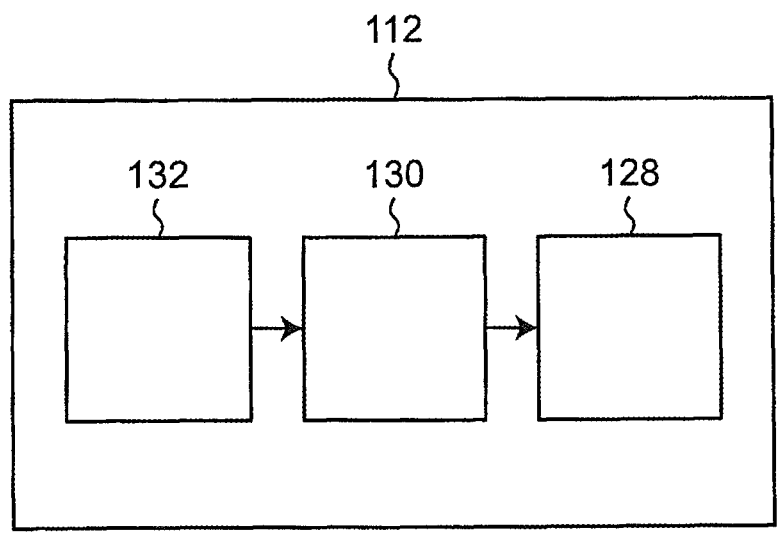
FIG. 12 is a block diagram of a recorder according to Embodiment 8.
Figure 13:
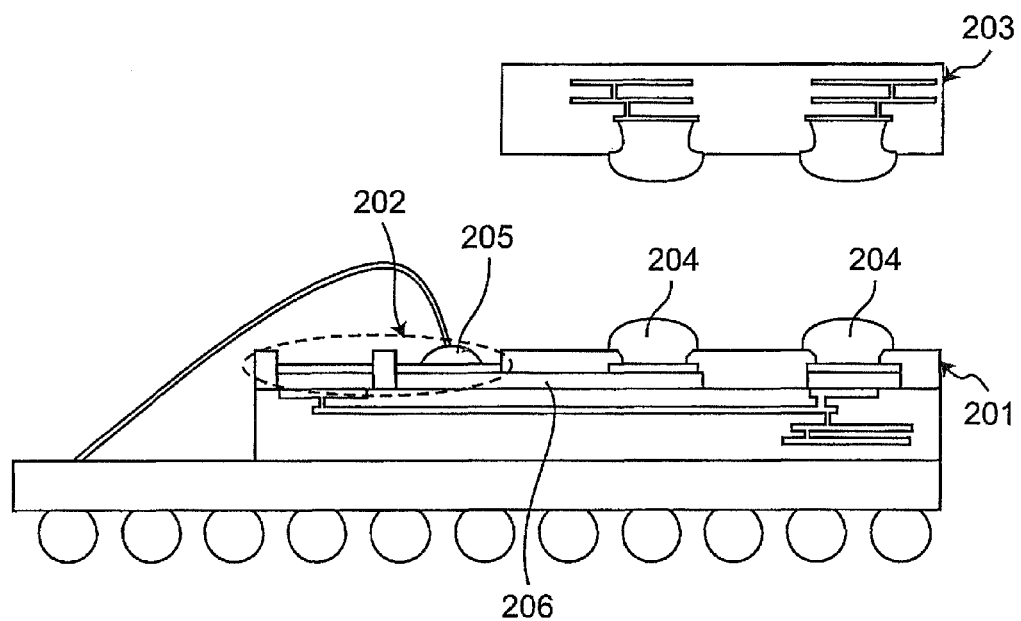
FIG. 13 is a cross-sectional view of a semiconductor device as a conventional example of Patent Literature 1.
Figure 14:
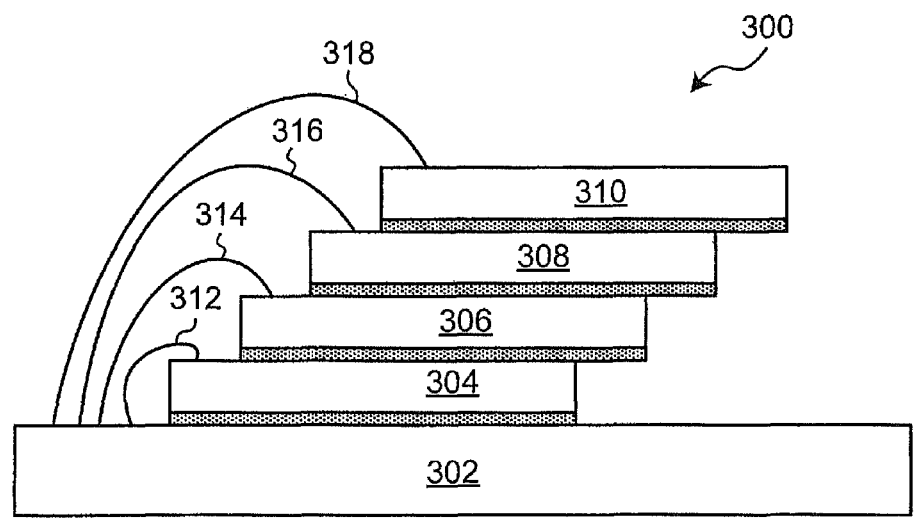
FIG. 14 is a cross-sectional view of an integrated circuit package as a conventional example of Patent Literature 2.
Figure 15:
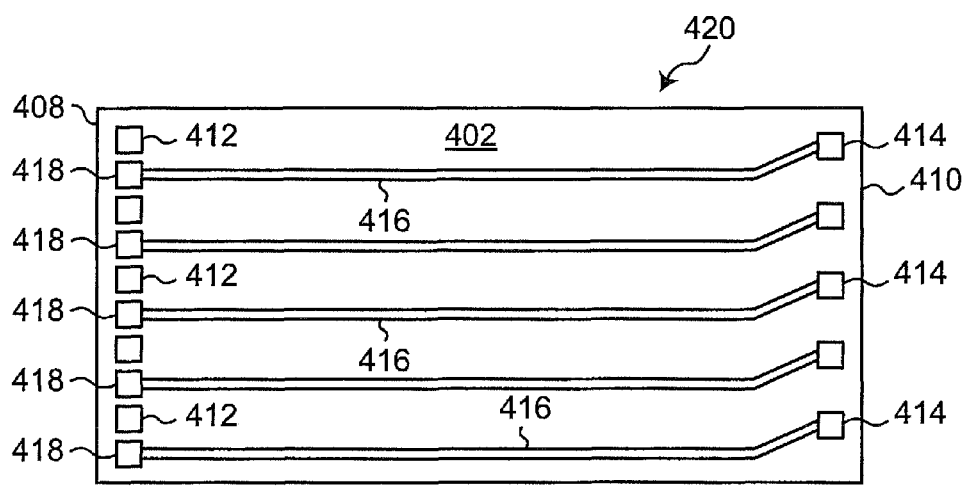
FIG. 15 is a top view of an integrated circuit package as a conventional example of Patent Literature 2.

FIG. 12 shows a block diagram of the recorder 112 shown in FIG. 10. The digital television 112 includes an interface part 132 as an interface with outside, a semiconductor device 130 which outputs data based on a signal from the interface part 132, and a recording part 128 which records the data outputted from the semiconductor device 130.

The semiconductor device 130 outputs the data based on the signal from the interface part 132 as the interface with outside, and then the recording part 128 records the data outputted from the semiconductor device 130.

The interface part 132 may be an interface corresponding to the HDMI standard, for example. Alternatively, the interface part 132 may correspond to other interface standards. The semiconductor device 130 may include a semiconductor device according to any of Embodiments 1 to 7 described above, for example. The recording part 128 may be a BD (Blu-ray Disc) recording device, a hard-disk recording device, a SD (Secure Digital) card recording device or the like, for example. Alternatively, the recording part 128 may be other types of recording device.

The digital television 110 according to Embodiment 8 uses the semiconductor device 124 having a high data transfer rate, thereby making it possible to transmit signals stably. Similarly, the recorder 112 according to Embodiment 8 uses the semiconductor device 130 having a high data transfer rate, thereby making it possible to transmit signals stably.

The present invention is not limited to the above-described embodiments, but is practicable in various forms.

Any combination of the various embodiments referred to above can produce respective effects.

The semiconductor devices according to the above Embodiments are not dependent on magnitude relationships among the plurality of semiconductor chips stacked, and do not require special steps of adding wiring layers to semiconductor chip placed on lower stages in stacking. Thus, simplicity of assembling the semiconductor packages and combination flexibility of the semiconductor chips to be stacked can be both improved. Also, data transfer rates and heat dissipation characteristics enough for high performance of systems such as a digital television and a recorder can be realized.

Although the present invention has been fully described by way of preferred embodiments with reference to the accompanying drawings, it is to be noted here that various changes and modifications will be apparent to those skilled in the art. Therefore, unless such changes and modifications otherwise depart from the scope of the present invention as set forth in the appended claims, they should be construed as being included therein.

The contents of a specification, drawings and claims of a Japanese patent application No. 2012-090205 filed Apr. 11, 2012 are herein expressly incorporated by reference in their entirety.

The invention claimed is:

1. A semiconductor device comprising:
   a first semiconductor chip;
   a second semiconductor chip provided on the first semiconductor chip with having chip-on-chip connection to the first semiconductor chip; and
   a first extension part which is formed on a periphery of or lateral to the first semiconductor chip and supports the second semiconductor chip, wherein
   when seen from a direction perpendicular to an upper surface of the second semiconductor chip, an outline of the second semiconductor chip is larger than an outline of the first semiconductor chip,
   a plurality of electrode terminals for the first semiconductor chip are provided on an upper surface of the first semiconductor chip,
   the plurality of electrode terminals for the first semiconductor chip comprise one or more first covered terminals which are covered with the second semiconductor chip and one or more first uncovered terminals which are not covered with the second semiconductor chip, and wherein
   one or more extension terminals are provided on an upper surface of the first extension part, and at least one of the extension terminals and at least one of the first covered terminals are connected by rewiring.

2. The semiconductor device according to claim 1, wherein the one or more extension terminals and the one or more first uncovered terminals are used as wire-bonding terminals.

3. The semiconductor device according to claim 1, wherein at least one of the first uncovered terminals acts as an antenna or is connected to an antenna.

4. The semiconductor device according to claim 1, further comprising a wiring substrate comprising a wiring layer, wherein the wiring layer forms the rewiring.

5. The semiconductor device according to claim 1, further comprising:
   a third semiconductor chip provided under the first semiconductor chip or under the first extension part; and
   a second extension part is formed on a periphery of or lateral to the third semiconductor chip, wherein
   the third semiconductor chip and the second extension part support the first semiconductor chip and the first extension part,
   a plurality of electrode terminals for the third semiconductor chip are provided on an upper surface of the third semiconductor chip,
   the plurality of electrode terminals for the third semiconductor chip comprise a second covered terminal which is covered with the first semiconductor chip or under the first extension part, and a second uncovered terminal which is not covered with the first semiconductor chip or under the first extension part.

6. The semiconductor device according to claim 5, wherein the first uncovered terminal and the second uncovered terminal are arranged on other sides.

7. The semiconductor device according to claim 1, wherein the extension part is an insulated component.

8. The semiconductor device according to claim 1, wherein the plurality of uncovered terminals are arranged on neighboring sides of the first semiconductor chip.

9. The semiconductor device according to claim 1, wherein the first semiconductor chip and the second semiconductor chip are arranged such that, when seen from the direction perpendicular to the upper surface of the second semiconductor chip, one side of the first semiconductor chip is not parallel to and not perpendicular to one side of the second semiconductor chip.

10. The semiconductor device according to claim 1, wherein the plurality of first covered terminals comprise a plurality of connecting terminals, and wherein the plurality of connecting terminals comprise a terminal connected to the second semiconductor chip and a terminal not connected to the second semiconductor chip.

11. The semiconductor device according to claim 1, wherein the first semiconductor chip is a logic circuit chip and the second semiconductor chip is a memory chip.

12. The semiconductor device according to claim 1, wherein a priority signal is transmitted through the one or more uncovered terminals and a normal signal is transmitted through the one or more covered terminals.

13. The semiconductor device according to claim 1, wherein, a signal having a highest data transfer rate of signals inputted to or outputted from the first semiconductor chip is transmitted through the one or more uncovered terminals.

14. A digital television comprising:
an interface part which acts as an interface with outside;
the semiconductor device according to claim 1, which outputs data based on a signal from the interface part; and
a display part which displays based on the data outputted from the semiconductor device.

15. A recorder comprising:
an interface part which acts as an interface with outside;
the semiconductor device according to claim 1, which outputs data based on a signal from the interface part; and
a recording part which records the data outputted from the semiconductor device.

\* \* \* \* \*